(12) United States Patent
Pendse et al.

(10) Patent No.: US 6,828,220 B2
(45) Date of Patent: Dec. 7, 2004

(54) FLIP CHIP-IN-LEADFRAME PACKAGE AND PROCESS

(75) Inventors: Rajendra D. Pendse, Fremont, CA (US); Marcos Karnezos, Palo Alto, CA (US); Walter A. Bush, Jr., San Jose, CA (US)

(73) Assignee: ChipPAC, Inc., Fremont, CA (US)

( * ) Notice: Subject to any disclaimer, the term of this patent is extended or adjusted under 35 U.S.C. 154(b) by 2 days.

(21) Appl. No.: 09/802,443

(22) Filed: Mar. 9, 2001

(65) Prior Publication Data

US 2002/0031902 A1 Mar. 14, 2002

Related U.S. Application Data

(60) Provisional application No. 60/188,564, filed on Mar. 10, 2000.

(51) Int. Cl.[7] .................................................. H01L 21/44
(52) U.S. Cl. ..................... 438/612; 438/613; 438/616; 257/620; 257/626; 257/735; 257/786
(58) Field of Search ................................. 438/612, 613, 438/616; 257/620, 626, 735, 786

(56) References Cited

U.S. PATENT DOCUMENTS

| | | | | |
|---|---|---|---|---|
| 3,670,396 A | * | 6/1972 | Lindberg | 228/106 |
| 4,010,885 A | * | 3/1977 | Keizer et al. | 228/6.2 |
| 4,605,833 A | * | 8/1986 | Lindberg | 219/56.22 |
| 4,867,715 A | * | 9/1989 | Roth et al. | 439/876 |
| 5,252,853 A | * | 10/1993 | Michii | 257/666 |
| 5,463,245 A | * | 10/1995 | Hiruta | 257/620 |
| 5,789,803 A | * | 8/1998 | Kinsman | 257/666 |
| 5,946,590 A | * | 8/1999 | Satoh | 438/613 |
| 6,008,532 A | | 12/1999 | Carichner | |
| 6,150,724 A | | 11/2000 | Wenzel et al. | |
| 6,172,419 B1 | * | 1/2001 | Kinsman | 257/737 |
| 6,214,642 B1 | | 4/2001 | Chen et al. | |
| 6,225,144 B1 | | 5/2001 | How et al. | |
| 6,258,622 B1 | * | 7/2001 | Lin et al. | 438/106 |
| 6,348,399 B1 | * | 2/2002 | Lin | 438/616 |
| 6,350,668 B1 | * | 2/2002 | Chakravorty | 438/612 |
| 6,369,448 B1 | * | 4/2002 | McCormick | 257/777 |
| 6,376,352 B1 | * | 4/2002 | Arnold et al. | 438/612 |
| 6,408,510 B1 | * | 6/2002 | Hembree | 29/841 |
| 6,410,415 B1 | * | 6/2002 | Estes et al. | 438/612 |
| 6,441,488 B1 | * | 8/2002 | Smith | 257/738 |

FOREIGN PATENT DOCUMENTS

TW        289145        10/1996

* cited by examiner

*Primary Examiner*—Matthew Smith
*Assistant Examiner*—Victor V Yevsikov
(74) *Attorney, Agent, or Firm*—Bill Kennedy; Haynes Beffel & Wolfeld LLP

(57) ABSTRACT

A method for connecting a chip to a leadframe includes forming bumps on a die by a Au stud-bumping technique, and attaching the chip to the leadframe by thermo-compression of the bumps onto bonding fingers of the leadframe. Also a flip chip-in-leadframe package is made according to the method. The package provides improved electrical performance particularly for devices used in RF applications.

18 Claims, 2 Drawing Sheets

FLIP CHIP-IN-LEADFRAME PACKAGE AND PROCESS

CROSS REFERENCE TO RELATED APPLICATIONS

This application claims priority from U.S. Provisional Application No. 60/188,564, titled "Flip Chip-in-Leadframe Package and Process", filed Mar. 10, 2000. This application is related to commonly assigned copending U.S. Application titled "Packaging Structure and Method" and U.S. Application titled "Flip Chip Interconnection Structure"; both said related applications are being filed on the same date as this application, and are hereby incorporated by reference in their entireties herein.

BACKGROUND OF THE INVENTION

This invention relates to leadframe-based packages and, more particularly, to flip chip interconnection to the leadframe.

Leadframe-based packages are used extensively in electronic packaging due to their low cost. The first level interconnection is typically achieved through wire bonding. Recent demands for improved electrical performance, particularly for devices used in RF applications, has led to consideration of "flip chip" interconnection to the leadframe.

Conventional flip chip devices employ solder bumps to make contact between the die and the bonding fingers of the leadframe. Devices based on solder bumps have not been accepted for many applications, because of high cost and because the process of soldering bumps to leadframes presents technical challenges, such as solder run-out. What is needed is a package configuration that accomplishes flip chip interconnection to the leadframe but which retains the low cost of conventional leadframe-based packaging.

BRIEF SUMMARY OF THE INVENTION

A flip chip-in-leadframe package includes a chip having bumps that are bonded directly to the bonding fingers of the leadframe. According to the invention, bumps are formed on the die by a stud-bumping technique employing a metal such as gold; and the chip is attached to the leadframe by thermo-compression of the bumps onto the bonding fingers of the leadframe.

Accordingly, in one general aspect the invention features a method for connecting a die to a leadframe, by forming metal bumps on the die, contacting the bumps with bonding fingers of a lead frame, heating the bumps, and pressing the bumps against the bonding fingers. The thermo-compression process results in deformation of the In some embodiments of the method the bumps are formed by a "stud-bumping" technique employing a wire bonding machine, as is well-known in the chip packaging art. The metal forming the bumps can be any of a variety of metals and alloys having a large range of plasticities. In particular embodiments the metal includes gold.

The bumps can be heated by, for example, applying heat to the die.

In some embodiments of the method, where the die is situated cavity-down, the bonding fingers are supported on a substrate and the back side of the die is supported by a press, and the bumps are pressed against the bonding fingers by applying a force on the press to move the die and the substrate toward one another. The bumps are heated sufficiently to permit plastic deformation of the bump material under the applied pressing force to the extent of 15% to 20% of the original bump height. The combination of pressing force and temperature is selected according to the particular chosen metal or alloy; where gold is used, for example, the bumps are heated to a temperature in the range about 180° C.–400° C., and a force is applied equivalent to vertical loading in the range about 10 grams to 250 grams per bump. The substrate may, conveniently, have an adhesive surface, onto which the leadframe is affixed, and the substrate may be a sheet or film. In particular embodiments the substrate is a tape having a releasable adhesive, so that the substrate can be removed from the surface once the bumps have been connected to the bonding fingers. This can in some embodiments expose lands on the leadframe for connection.

It may be preferable to provide mechanical support between the die and the substrate. Accordingly, in some embodiments of the method, a measured quantity of fill material is dispensed onto the substrate before the bumps are contacted with the bonding fingers, so that as the die and the substrate are forced to move toward one another the material is compressed between the die and the substrate. Preferred fill materials include adhesive resins. The material is also displaced in the region below the bump as the bump deforms, thereby permitting the bump material to form direct metallurgical contact with the bond finger material. Preferably a sufficient quantity of the fill material is dispensed so that the material is forced to fill the volume defined generally between the die and the substrate. The material may be dispensed by any of a variety of techniques, including for example screen printing and extrusion through a nozzle.

The resulting flip chip-in-leadframe package is highly reliable, as the molding compound functions as the underfill in conventional flip chip packaging, thereby extending the life of the joints formed between the die and the leadframe. Moreover, the process is generally compatible with conventional plastic packaging process flow.

In another general aspect, the invention features a method for forming a plurality of flip chip-in-leadframe packages, by providing a plurality of leadframes each having a set of bonding fingers, providing a plurality of dies each having a set of metal bumps formed thereon, positioning the leadframes onto a support, placing the dies onto the leadframes such that each set of bumps contacts a set of bonding fingers, heating the bumps, and pressing the dies against the leadframes to compress the bumps onto the bonding fingers.

In some embodiments the package is transfer-molded by conventional techniques to form a molded package with any desired footprint such as a leaded or leadless configuration. In some embodiments the chip is situated cavity-up, and in other embodiments it is cavity-down. In some embodiments the back side of the die is exposed to provide improved thermal performance, or for other advantages.

The flip chip-in-leadframe package according to the invention is particularly useful in applications in which the smallest pitch of the bonding pads on the die is at least large enough to match the smallest bond finger pitch achievable in leadframes. The smallest bond finger pitch in currently available leadframes is generally in the order of 150 $\mu$m.

In another general aspect the invention features a flip chip-in-leadframe package, made by steps of providing a die having a set of bumps formed thereon, providing a leadframe having bonding fingers, contacting the die with the lead frame so that the set of bumps contacts the set of bonding fingers, heating the bumps, and pressing the bumps against the bonding fingers.

The process according to the invention is faster than conventional wire bonding, and uses considerably less Au (or other costly metal), owing to the fact that only one bond is formed rather than two. Moreover the flip chip attachment does not require use of die attach material and the subsequent curing operation. The flip chip connections are achieved according to the invention using standard wire bondable finish and thereby eliminating the necessity for additional processing or treatment of the leadframe.

DETAILED DESCRIPTION OF THE INVENTION

Generally, a flip chip-in-leadframe package according to the invention may have a "leaded" footprint or configuration, or a "leadless" configuration; and, where the device has a leadless configuration, the leads or bonding fingers may "fan outwardly" or "fan inwardly". Moreover, the die may be situated "cavity-upward" or "cavity-downward". Each arrangement provides advantages according to the particular application. The various configurations may be more fully understood by reference to the Figs. and to the description, following, referring thereto.

As will be appreciated, the drawings are diagrammatic sketches, showing various embodiments of the invention in simplified views for clarity of presentation. Typical devices according to the invention may have a much greater number of leads, for example, than are shown in the Figs.; and many details (such as, for example, details of the structure of the die itself), not necessary to an understanding of the invention, are omitted from the drawings. The drawings are not to scale.

Figure 1:
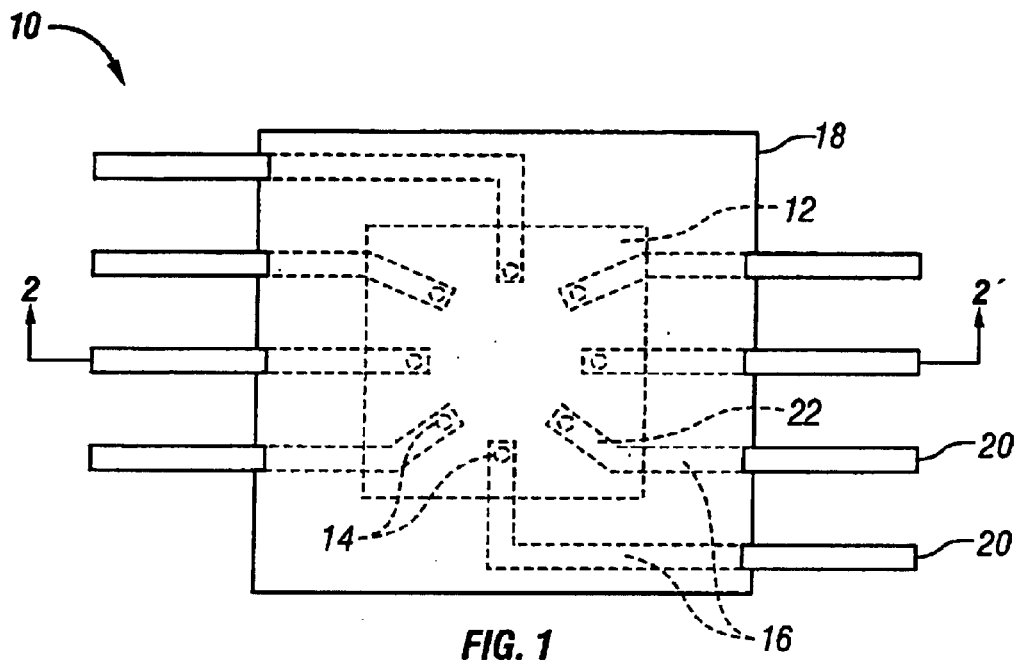
FIG. 1 is a diagrammatic sketch in a plan view of a cavity-down flip chip-in-leadframe package structure according to one embodiment of the invention, having a leaded footprint in which the leads fan outwardly.
Figure 2:
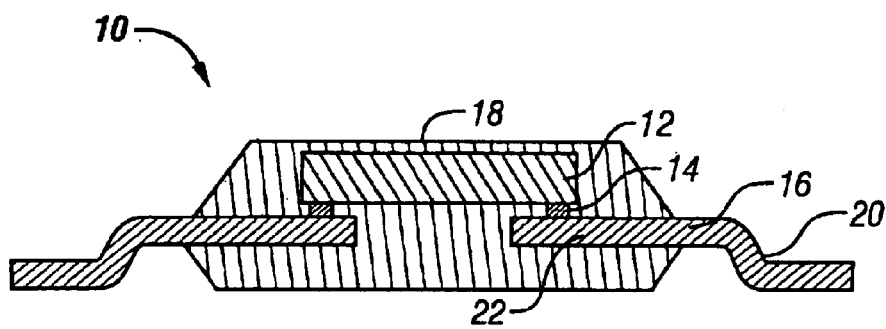
FIG. 2 is a diagrammatic sketch in a sectional view thru a flip chip-in-leadframe package structure as indicated at 2–2' in FIG. 1.

Turning now to the Figs., a flip chip-in-leadframe package 10 according to the invention is shown diagrammatically in a plan view in FIG. 1 and in a sectional elevational view in FIG. 2, having a leaded footprint in which the leads fan outwardly. The package 10 includes a die 12 having die bumps 14, and leadframes 16. Die 12 is attached by way of die bumps 14 to bonding fingers 22 of leadframes 16. In the embodiment shown in FIGS. 1 and 2 the die and bumps and portions of the leadframes are enclosed in a plastic body 18, leaving the ends 20 of the leads exposed at the periphery for connection.

The die bumps can be formed by any of a variety of techniques, including techniques well known in the art. The die bumps preferably are formed by a technique such as gold stud bumping and electroplating. The bumps preferably are formed by a gold stud-bumping technique, an operation similar to wire bonding.

The plastic body can be formed by any of a variety of techniques, including techniques well known in the art. The body preferably is formed by a conventional plastic packaging process, in which the die 12 and portions of the leadframes 16 are encased in a transfer-molded plastic.

Figure 3:
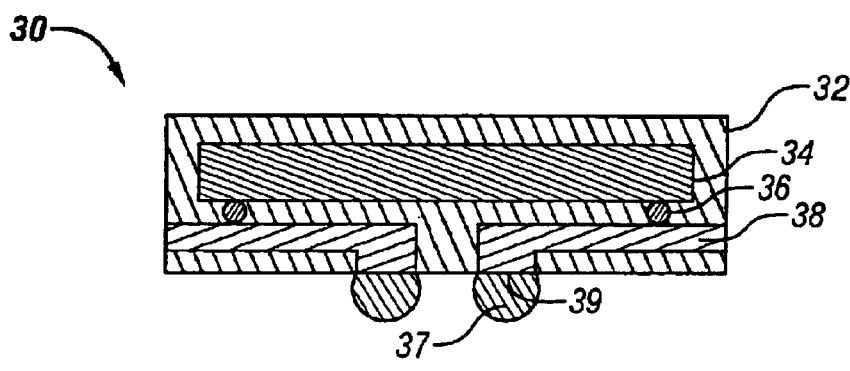
FIG. 3 is a diagrammatic sketch in a sectional view thru a cavity-down flip chip-in-leadframe package structure according to another embodiment of the invention, having a leadless footprint in which the die pads are located toward the periphery of the package and the lands are located toward the center of the package.

The invention is particularly useful in construction of flip chip-in-leadframe packages having any of a variety of leadless footprints. For example, FIG. 3 shows a cavity-down leadless package construction generally at 30 in which the die bumps 36 are peripherally located, while the leadframe 38 lands 39 for attachment of solder balls 37 for connection of the package are centrally located.

Figure 4:
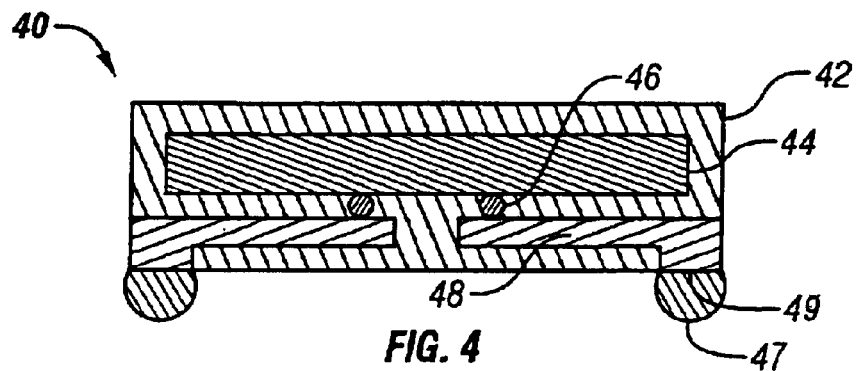
FIG. 4 is a diagrammatic sketch in a sectional view thru a cavity-down flip chip-in-leadframe package structure according to another embodiment of the invention, having a leadless footprint in which the die pads are located toward the center of the package and the lands are located toward the periphery of the package.

And, for example, FIG. 4 shows a cavity-down leadless package construction generally at 40 in which the die bumps 46 are centrally located, while the leadframe 48 lands 49 for attachment of solder balls 47 for connection of the package are peripherally located.

Figure 5:
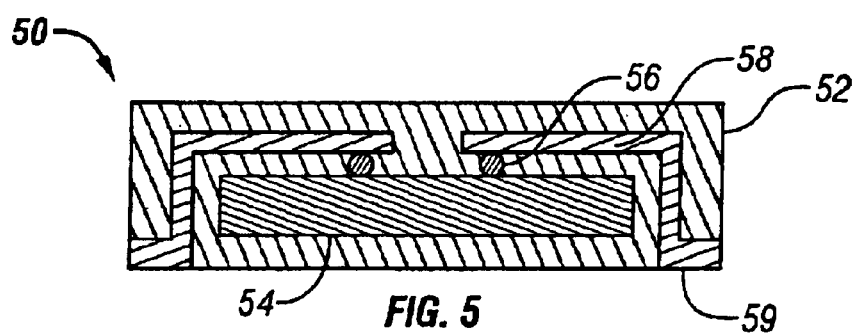
FIG. 5 is a diagrammatic sketch in a sectional view thru a cavity-up flip chip-in-leadframe package structure according to another embodiment of the invention, having a leadless footprint in which the die pads are located toward the center of the package and the lands are located toward the periphery of the package.

And, for example, FIG. 5 shows a cavity-up leadless package construction generally a 50 in which the die bumps 56 are centrally located, while the leadframe 58 lands 59 are situated peripherally.

Figure 6:
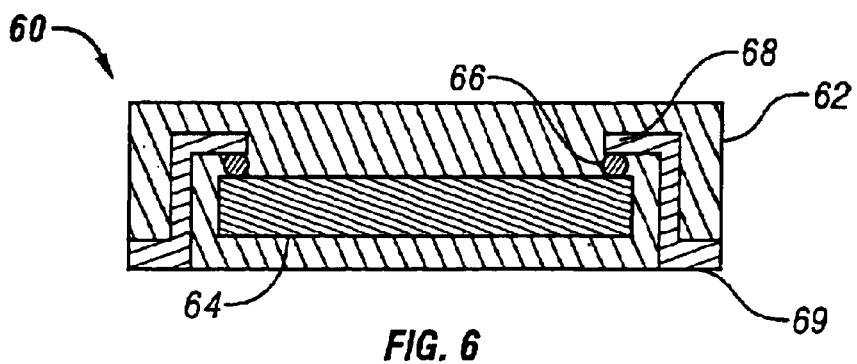
FIG. 6 is a diagrammatic sketch in a sectional view thru a cavity-up flip chip-in-leadframe package structure according to another embodiment of the invention, having a leadless footprint in which the die pads are located toward the periphery of the package and the lands are located toward the center of the package.

And, for example, FIG. 6 shows a cavity-up leadless package construction generally a 60 in which the die bumps 66 are peripherally located, as are the leadframe 68 lands 69.

Any of these configurations may be employed in either a ball grid array, in which connection is made through solder balls, or in a land grid array, in which no solder balls are employed in making the connection.

The invention can be particularly useful in low I/O applications where a small package is desired. Typical applications may employ, for example, fewer than 100 pins and may be less that one mm thick with a package body in the range about 3 mm square to 12 mm square. Such applications may include analog, RF, GaAs, SiGe, Logic, MicroController, RDRAM, Flash, and EEPROM, among others.

The manufacturing process includes the following general scheme. A temporary adhesive tape is applied to the leadframe, to act as a support substrate. A measured quantity of fill material is deposited onto the substrate, for example by use of a syringe or by screen printing. The die is placed so that the bumps are appropriately aligned with the leadframe fingers, and then the die is bonded to the leadframe by thermo-compression; in the same step the adhesive is distributed and cured. Optionally the package is overmolded with a polymer to enclose the die and leadframe. Typically the packages are constructed in a multiple array, and then singulated.

The manufacturing cost is comparatively low, particularly where a copper leadframe construction is employed. Package thermal and electrical performance can be improved according to the invention. The leadframe traces can be kept short for improved electrical performance and reduced electrical parasitic effects, and in some configurations the use of copper leadframe and solder balls beneath the die can give improved thermal performance. In configurations employing center lands the board level reliability can be improved, even for larger dies.

What is claimed is:

1. A method for connecting a die to a leadframe, comprising:
    forming metal bumps on the die,
    contacting the bumps with bonding fingers on a leadframe,
    heating the bumps without melting, and
    pressing the bumps against the bonding fingers,
wherein the heating step and the pressing step are carried out at a temperature and pressure sufficient to result in deformation of the bump material to an extent of between about 15% and about 20% of the original bump height.

2. The method of claim 1 wherein the step of forming the metal bumps comprises stud bumping.

3. The method of claim 1 wherein the step of forming the metal bumps comprises electroplating.

4. The method of claim 1 wherein the metal bumps comprise gold.

5. The method of claim 1 wherein the step of heating the bumps comprises heating the die.

6. The method of claim 1, further comprising
    supporting the bonding fingers on a substrate, and
    supporting the die by a press,
    wherein the step of pressing the bumps against the bonding fingers comprises applying a force to move the die and the substrate toward one another.

7. The method of claim 1 wherein the metal bumps comprise gold, and the heating step comprises heating the bumps to a temperature in the range about 100° C. to about 400° C., and the pressing step comprises applying a force equivalent to vertically loading in the range about 10 grams to 250 grams per bump.

8. The method of claim 1 wherein the fill material comprises an adhesive resin.

9. The method of claim 1, further comprising a step of overmolding to enclose the die and leadframe fingers.

10. A method for forming a plurality of chip-in-leadframe packages, comprising
    providing a plurality of leadframes each comprising a set of bonding fingers,
    providing a plurality of dies each having a set of metal bumps formed thereon,
    positioning the leadframes onto a support,
    placing the dies onto the leadframes such that each set of bumps contacts a set of bonding fingers,
    heating the bumps without melting, and
    pressing the dies against the leadframes to compress the bumps onto the bonding fingers,
wherein the metal bumps comprise gold, and the heating step comprises heating the bumps to a temperature in the range about 100° C. to about 400° C., and the pressing step comprises applying a force equivalent to vertically loading in the range about 10 grams to 250 grams per bump.

11. The method of claim 10, further comprising the steps, prior to contacting the bumps with the binding fingers of the leadframe, of
    supporting the leadframe on a substrate, and
    dispensing a measured quantity of a fill material onto the substrate within each set of leadframe binding fingers.

12. The method of claim 10, further comprising the steps of singulating the chip-in-leadframe packages.

13. A chip-in-leadframe package made according to the method of claim 12 wherein the die is situated cavity upward in relation to the set of bonding fingers.

14. A chin-in-leadframe package made according to the method of claim 12 wherein the die is situated cavity downward in relation to the set of bonding fingers.

15. A chin-in-leadframe package made according to the method of claim 12 wherein the leads fan inwardly.

16. A chip-in-leadframe package made according to the method of claim 12 wherein the leads fan outwardly.

17. The method of claim 10 wherein the heating step and the pressing step are carried out at a temperature and pressure sufficient to result in deformation of the bump material to an extent of between about 15% and about 20% of the original bump height.

18. The method of claim 10, further comprising a step of overmolding to enclose the die and leadframe fingers.

* * * * *